United States Patent
Son et al.

(10) Patent No.: US 8,507,918 B2
(45) Date of Patent: *Aug. 13, 2013

(54) MULTILAYER SEMICONDUCTOR DEVICES WITH CHANNEL PATTERNS HAVING A GRADED GRAIN STRUCTURE

(75) Inventors: Yong-Hoon Son, Yongin-si (KR); Myoungbum Lee, Seoul (KR); Kihyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 274 days.

This patent is subject to a terminal disclaimer.

(21) Appl. No.: 13/018,833

(22) Filed: Feb. 1, 2011

(65) Prior Publication Data
US 2011/0186851 A1    Aug. 4, 2011

(30) Foreign Application Priority Data
Feb. 2, 2010    (KR) .................. 10-2010-0009628

(51) Int. Cl.
*H01L 29/04*    (2006.01)
(52) U.S. Cl.
USPC .................... 257/74; 257/E29.003
(58) Field of Classification Search
None
See application file for complete search history.

(56) References Cited

U.S. PATENT DOCUMENTS

| | | | |
|---|---|---|---|
| 7,382,018 B2 | 6/2008 | Kim et al. | |
| 8,283,228 B2 * | 10/2012 | Alsmeier | 438/257 |
| 8,330,208 B2 * | 12/2012 | Alsmeier et al. | 257/321 |
| 2008/0067583 A1 | 3/2008 | Kidoh et al. | |
| 2008/0173928 A1 | 7/2008 | Arai et al. | |
| 2011/0316064 A1 * | 12/2011 | Kim et al. | 257/314 |

FOREIGN PATENT DOCUMENTS

| | | |
|---|---|---|
| JP | 2008-072051 | 3/2008 |
| JP | 2008-159699 | 7/2008 |
| KR | 1020060089547 A | 8/2006 |
| KR | 1020080058251 A | 6/2008 |

* cited by examiner

*Primary Examiner* — Benjamin Sandvik
(74) *Attorney, Agent, or Firm* — Myers Bigel Sibley & Sajovec, P.A.

(57) ABSTRACT

Memory devices include a stack of interleaved conductive patterns and insulating patterns disposed on a substrate. A semiconductor pattern passes through the stack of conductive patterns and insulating patterns to contact the substrate, the semiconductor pattern having a graded grain size distribution wherein a mean grain size in a first portion of the semiconductor pattern proximate the substrate is less than a mean grain size in a second portion of the semiconductor pattern further removed from the substrate. The graded grain size distribution may be achieved, for example, by partial laser annealing.

12 Claims, 15 Drawing Sheets

MULTILAYER SEMICONDUCTOR DEVICES WITH CHANNEL PATTERNS HAVING A GRADED GRAIN STRUCTURE

CROSS-REFERENCE TO RELATED APPLICATIONS

This U.S. non-provisional patent application claims priority under 35 U.S.C. §119 of Korean Patent Application No. 10-2010-0009628, filed on Feb. 2, 2010, the entire contents of which are hereby incorporated by reference.

BACKGROUND OF THE INVENTION

The present disclosure herein relates to memory devices and methods of fabrication therefore and, more particularly, to multilayer memory devices and methods of fabrication therefor.

The degree of integration of semiconductor memory devices has continued to increase to meet user demands for superior performance and low price. In conventional planar ("two dimensional") semiconductor memory devices, the degree of integration is generally determined by the area which a unit memory cell occupies. Therefore, integration of the device may be limited by the ability to form fine patterns. Producing finer patterns may require expensive production equipment.

"Three dimensional" (multilayer) memory devices including memory cells arranged in multiple layers have been proposed as a technique for increasing device density. However, mass production of such memory devices may require process technology that can realize a reliable quality of a product while reducing manufacturing cost per bit in comparison to conventional two dimensional semiconductor memory devices.

SUMMARY OF THE INVENTION

Some embodiments of the inventive subject matter provide memory devices including a stack of interleaved conductive patterns and insulating patterns disposed on a substrate and a semiconductor pattern passing through the stack of conductive patterns and insulating patterns to contact the substrate. The semiconductor pattern has a graded grain size distribution wherein a mean grain size in a first portion of the semiconductor pattern proximate the substrate is less than a mean grain size in a second portion of the semiconductor pattern further removed from the substrate. The graded grain size distribution may be achieved, for example, by partial laser annealing. The devices may further include a data storage layer interposed between the semiconductor pattern and the conductive patterns.

Further embodiments provide memory devices including a ground select line pattern on a substrate, a stack of interleaved word line patterns and insulating patterns disposed on the ground select line pattern and a semiconductor pattern passing through the gate patterns, the insulating patterns and the ground select line pattern to contact the substrate. The semiconductor pattern has a first portion disposed laterally adjacent the ground select line pattern and having a first mean grain size and a second portion disposed laterally adjacent the word line patterns and having a second mean grain size greater than the first mean grain size.

Additional embodiments provide methods of fabricating memory devices. A stack of layers is formed on a substrate. An opening is formed through the layers, exposing the substrate. A precursor semiconductor pattern is formed in the opening. A portion of the precursor semiconductor pattern is melted while leaving a portion of the precursor semiconductor pattern proximate the substrate in a solid state, e.g., by a partial laser annealing. The melted portion of the precursor semiconductor pattern is recrystallized. The recrystallizing may leave a semiconductor pattern in the opening having a graded grain size distribution wherein a mean grain size in a first portion of the semiconductor pattern proximate the substrate is less than a mean grain size in a second portion of the semiconductor pattern further removed from the substrate. The stack of layers may include a stack of interleaved conductive patterns and insulating patterns on the substrate.

In some embodiments, the stack of layers may include a ground select line pattern on the substrate and a stack of interleaved word line patterns and insulating patterns on the ground select line pattern. Melting a portion of the precursor semiconductor pattern while leaving a portion of the precursor semiconductor pattern proximate the substrate in a solid state may include melting a portion of the precursor semiconductor pattern laterally adjacent the word line patterns while leaving a portion of the precursor semiconductor pattern laterally adjacent the ground select line pattern in a solid state.

BRIEF DESCRIPTION OF THE DRAWINGS

The accompanying drawings are included to provide a further understanding of the inventive subject matter, and are incorporated in and constitute a part of this specification. The drawings illustrate exemplary embodiments of the inventive subject matter and, together with the description, serve to explain principles of the inventive subject matter. In the figures.

DETAILED DESCRIPTION

Figure 1:
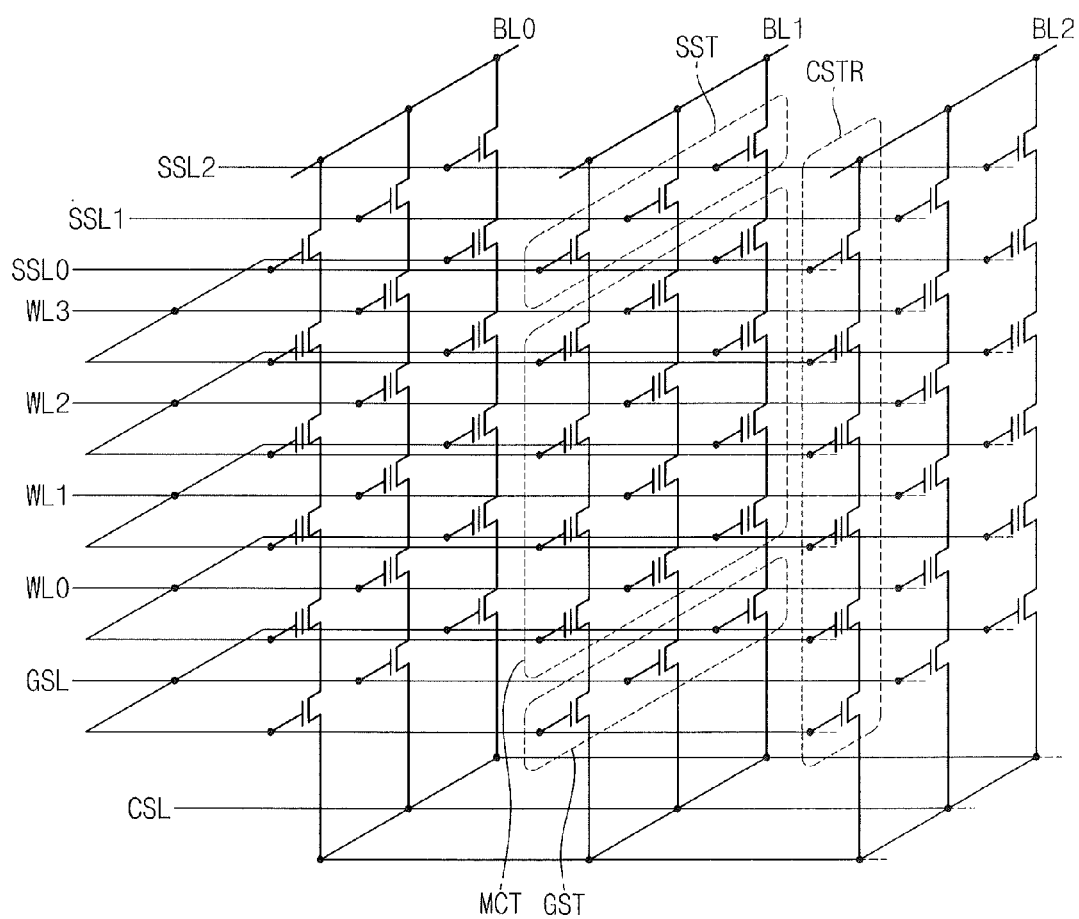
FIG. 1 is a circuit diagram illustrating a three dimensional semiconductor memory device in accordance with some embodiments of the inventive subject matter.

Some embodiments of the inventive subject matter will be described below in more detail with reference to the accompanying drawings. The embodiments of the inventive subject matter may, however, be embodied in different forms and should not be constructed as limited to the embodiments set forth herein. Rather, these embodiments are provided so that this disclosure will be thorough and complete, and will fully convey the scope of the inventive subject matter to those skilled in the art. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will also be understood that when an element such as a layer, region or substrate is referred to as being "on" or "onto" another element, it may lie directly on the other element or intervening elements or layers may also be present Embodiments of the inventive subject matter may be described with reference to cross-sectional illustrations, which are schematic illustrations of idealized embodiments of the present invention. In the drawings, the thickness of layers and regions are exaggerated for clarity. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Hereinafter, embodiments of the inventive subject matter are described in detail with reference to the drawings. A semiconductor memory device in accordance with some embodiments of the inventive subject matter has a three-dimensional structure.

Figure 2:
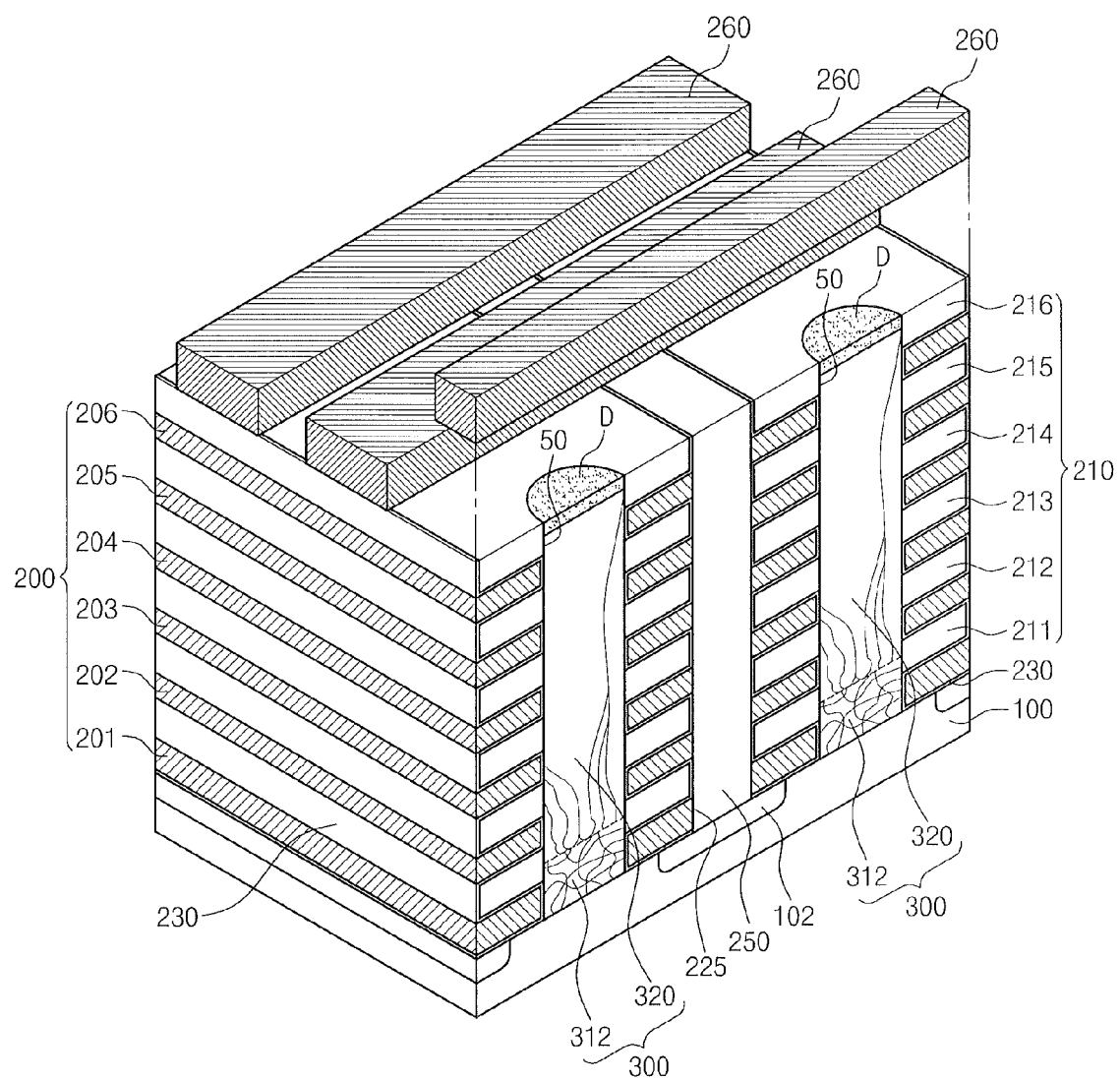
FIG. 2 is a perspective view illustrating a three dimensional semiconductor memory device in accordance with some embodiments of the inventive subject matter.
Figure 3:
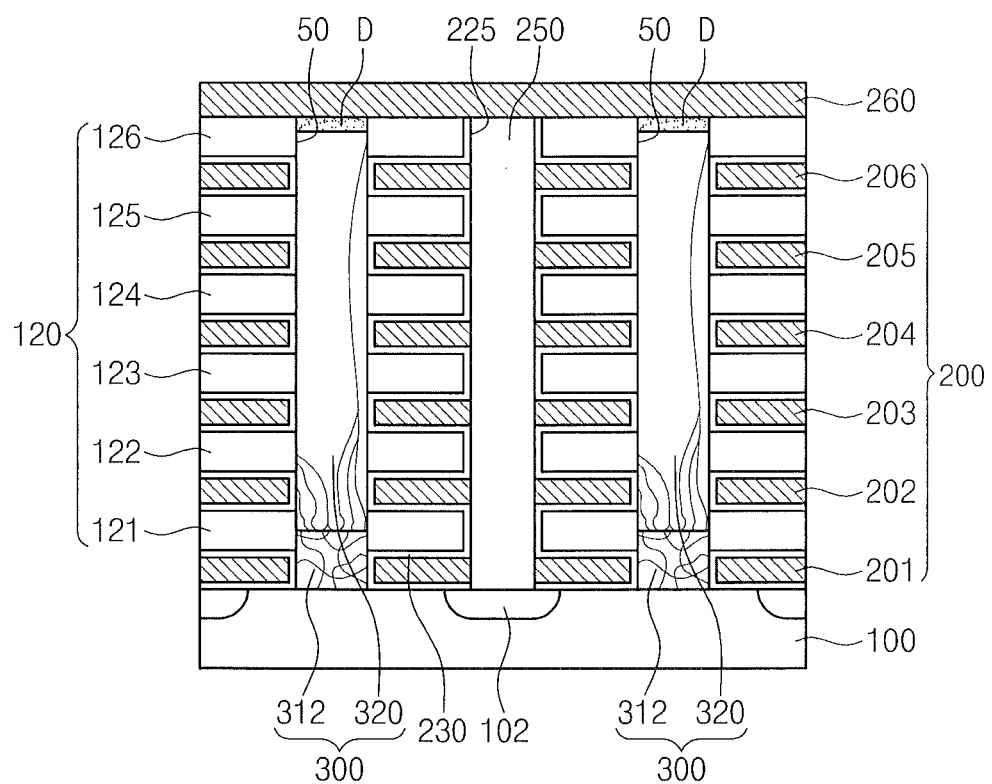
FIG. 3 is a cross sectional view illustrating a three dimensional semiconductor memory device in accordance with some embodiments of the inventive subject matter.
Figure 4:
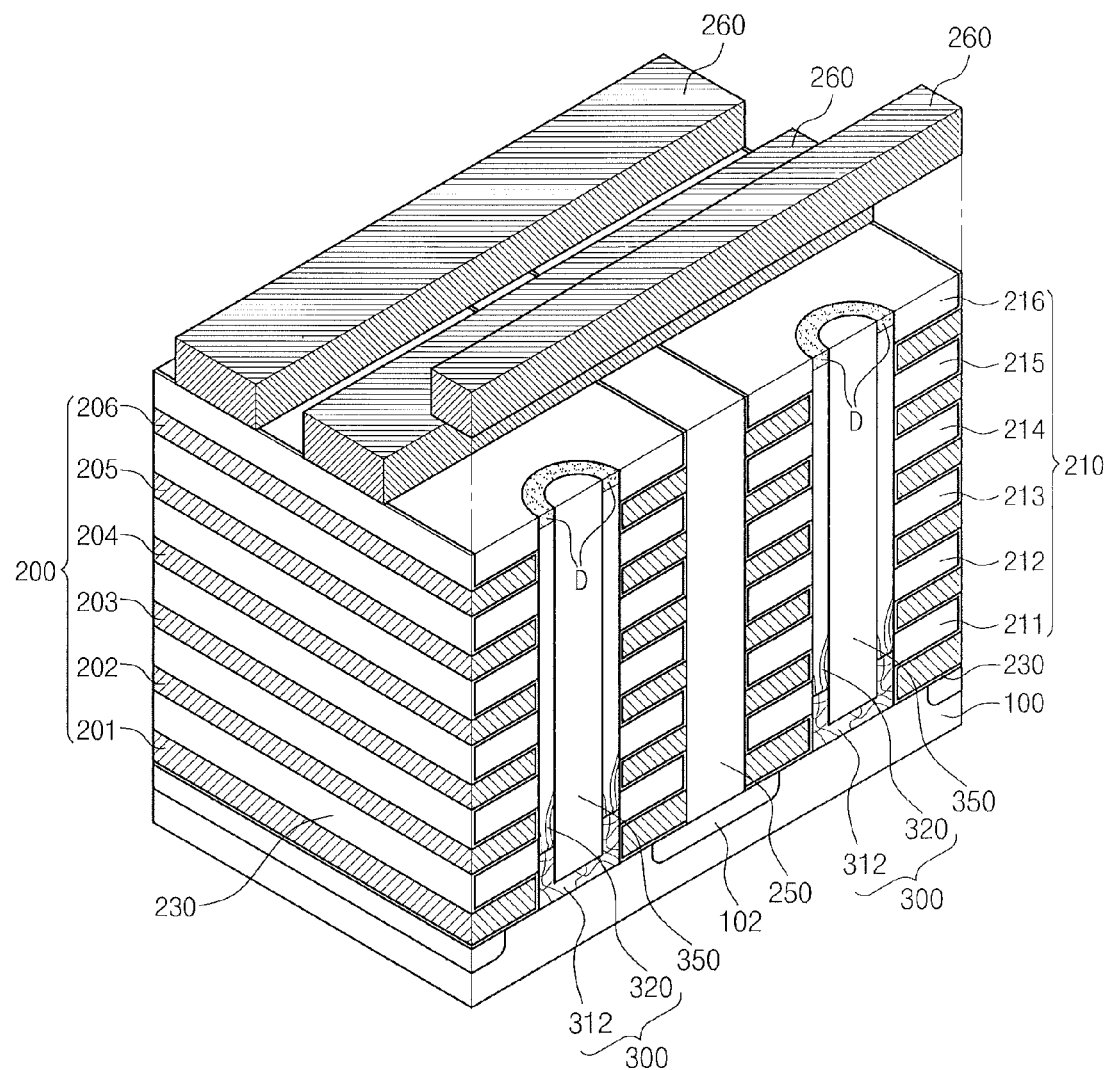
FIGS. 4 and 5 are perspective views illustrating a modified embodiment of a three dimensional semiconductor memory device in accordance with some embodiments of the inventive subject matter.
Figure 5:
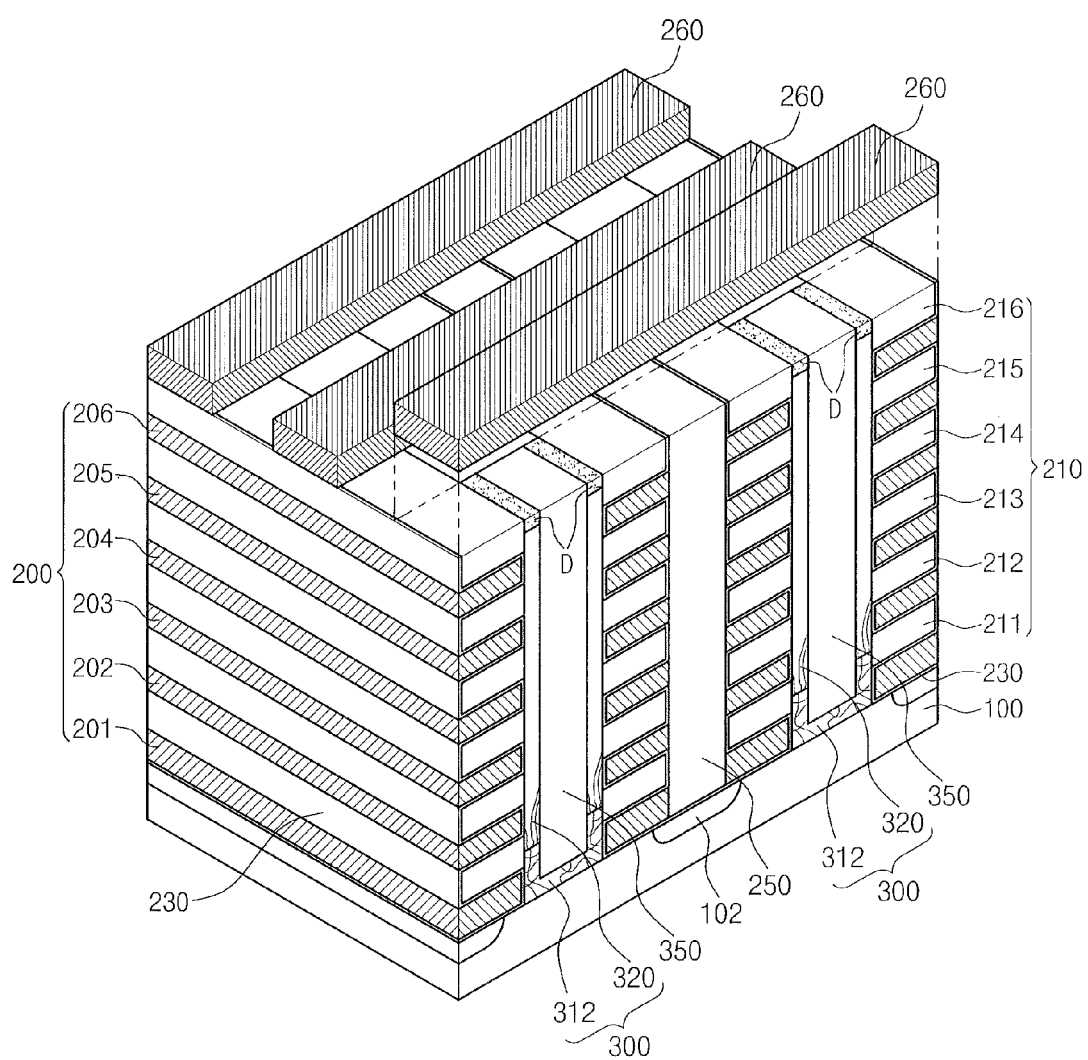

FIG. 1 is a circuit diagram illustrating a three dimensional semiconductor memory device in accordance with some embodiments of the inventive subject matter. FIG. 2 is a perspective view illustrating a three dimensional semiconductor memory device in accordance with some embodiments of the inventive subject matter. FIG. 3 is a cross sectional view illustrating a three dimensional semiconductor memory device in accordance with some embodiments of the inventive subject matter. FIGS. 4 and 5 are perspective views illustrating modified embodiments of a three dimensional semiconductor memory device in accordance with some embodiments of the inventive subject matter.

Referring to FIGS. 1 through 5, a three-dimensional semiconductor memory device may include a common source line CSL, a plurality of bit lines BL0, BL1 and BL2 and a plurality of cell strings CSTR disposed between the common source line CSL and the bit lines BL0, BL1 and BL2.

The common source line CSL may be, for example, a conductive layer disposed on a substrate 100 or an impurity region formed in the substrate 100.

The bit lines BL0, BL1 and BL2 may be, for example, conductive patterns (for example, metal lines) spaced apart on the substrate 100. The bit lines BL0, BL1 and BL2 are two dimensionally arranged and respective pluralities of cell strings CSTR are connected to respective ones of the bit lines BL0, BL1 and BL2 in parallel. Thus, the cell strings CSTR are two dimensionally arranged.

Each of the cell strings CSTR may include a ground select transistor GST connected to the common source line CSL, a string select transistor SST connected to the bit line and a plurality of memory cell transistors MCT disposed between the ground select transistor GST and the string select transistor SST. The ground select transistor GST, the string select transistor SST and the memory cell transistors MCT can be connected to one another in series. In addition, a ground select line GSL, a plurality of word lines WL0~WL3 and a plurality of string select lines SSL that are disposed between the common source line CSL and the bit lines BL0~BL2 may be used as gate electrodes of the ground select transistor GST, the memory cell transistors MCT and the string select transistors SST, respectively.

The ground select transistors GST may be disposed to be the same distance away from the substrate 100 and gate electrodes of the ground select transistors GST are connected to the ground select line GSL in common and thereby can be in an equipotential state. To achieve this, the ground select line may be, for example, a conductive pattern having a plate shape or a comb shape disposed between the common source line CSL and the closest memory cell transistor MCT to the ground select line GSL. Similarly, gate electrodes of the plurality of memory cell transistors MCT which are away the same distance from the common source line CSL are also connected to one of the word lines WL0~WL3 in common and thereby may be in an equipotential state. To achieve this, each of the word lines WL0~WL3 may be, for example, a conductive pattern having a comb shape parallel to the substrate 100.

One cell string CSTR includes a plurality of memory cell transistors MCT that are disposed at different levels with respect to the common source line CSL. Multilayer word lines WL0~WL3 are disposed at different levels with respect to the common source line CSL and the bit lines BL0, BL1 and BL2.

Each of the cell strings CSTR may include semiconductor patterns 300 which vertically extend from the common source line CSL or the substrate 100 to be connected to the bit line. The semiconductor patterns 300 penetrate the ground select line GSL and pass through the word lines WL0~WL3. In addition, the semiconductor patterns 300 may include impurity regions (for example, drain regions D of a transistor) near top portions thereof.

A data storage layer 230 may be disposed between the word lines WL0~WL3 and the semiconductor pattern 300. A dielectric layer used as a gate insulating layer of the ground select transistor GST or the string select transistor SST may be disposed between the ground select line GSL and the semiconductor pattern 300 or between the string select lines SSL and the semiconductor pattern 300. A gate insulating layer of at least one of the ground and string select transistors GST and SST may be formed, for example, of the same material as the data storage layer of the memory cell transistor MCT and may be a gate insulating layer (for example, a silicon oxide layer) for a conventional MOSFET.

The ground and string select transistors GST and SST and the memory cell transistors MCT may be, for example, a MOS field effect transistors (MOSFETs) using the semiconductor pattern 300 as a channel region. According to some embodiments, the semiconductor pattern 300 may form a MOS capacitor together with the ground select line GSL, the word lines WL0~WL3 and the string select lines SSL. In this case, the ground select transistor GST, the memory cell transistors MCT and the string select transistor SST can be electrically connected to one another by sharing an inversion layer formed by a fringe field from the ground select line GSL, the word lines WL0~WL3 and the string select lines SSL.

Operations of a three-dimensional semiconductor memory device in accordance with some embodiments of the inventive subject matter will now be described with reference to FIGS. 1 and 2. Program operations for writing data in memory cells include applying the same voltage to word lines WL0~WL3 disposed on the same layer and applying different voltages to word lines WL0~WL3 disposed on the different layers. A program voltage $V_{PGM}$ is applied to word lines of a layer including selected memory cells and a pass voltage $V_{PASS}$ is applied to word lines WL0~WL3 of an unselected layer. The program voltage $V_{PGM}$ may be a voltage of about 10~20V and the pass voltage $V_{PASS}$ may be a voltage that can turn on memory cells. A ground voltage 0V is applied to the bit line connected to a selected memory cell and a power supply voltage Vcc is applied to the other bit lines. The ground voltage 0V is applied to the ground select line GSL to turn off all the ground select transistors GST. Further, the power supply voltage Vcc is applied to a selected string select line SSL and the ground voltage 0V is applied to the other unselected string select lines SSL.

Under these voltage conditions, the selected string select transistor and memory cells included in the selected string may be turned on. Thus, channels of the memory cells included in the selected string have a potential (i.e., 0V) equivalent to the selected bit line BL0~BL2. Since the program voltage $V_{PGM}$ of high voltage is applied to a word line of the selected memory cell, a F-N tunneling phenomenon occurs and therefore the selected memory cell can be programmed.

Subsequently, a read operation of reading out data written in memory cells is described. The same voltage may be applied to word lines WL0~WL3 disposed on the same layer and different voltages may be applied to word lines WL0~WL3 disposed on the different layers. For read operations, 0V is applied to a word line connected to the selected memory cell and a read voltage Vread is applied to word lines of the unselected memory cells disposed at different layers. The read voltage Vread may be a voltage that can turn on the unselected memory cells. A bit line voltage Vbl of about 0.4~0.9 is applied to the selected bit line and 0V is applied to the other bit lines. 0V is applied to the common source line CSL and the read voltage Vread is applied to the ground select lines GSL and therefore a channel of the selected memory cell can be connected to the common source line CSL. Also, the read voltage Vread is applied to the selected string select line SSL and 0V is applied to the unselected string select line SSL.

Under these voltage conditions, a memory cell may be turned on or turned off according to data (0 or 1) stored in the selected memory cell. If the selected memory cell is turned on, a current can flow through a string and a change of a current flowing through a string can be detected through a bit line.

Referring to FIGS. 2 and 3, a three-dimensional semiconductor memory device in accordance with some embodiments of the inventive subject matter is described in detail. The semiconductor memory device includes a plurality of interconnection structures 200, each including stacked conductive patterns 201~206 with interlayer insulating layers 210 (211~216) interposed therebetween on a substrate 100. The substrate 100 may be, for example, a semiconductor pattern of a single crystalline structure and may include an impurity region 102 used as a common source line. In this case, the substrate 100 and the impurity region 102 used as the common source line may have different conductivity types from each other.

The conductive patterns 201~206 of the interconnection structure 200 may be used as the ground select line GSL, the word lines WL0~WL3 and the string select line SSL illustrated in FIG. 1. Thicknesses of the conductive patterns 201 and 206 used as the ground and string select lines GSL and SSL may be greater than thicknesses of the conductive patterns 202~205 used as the word lines WL0~WL3. The conductive patterns 201 and 206 used as the ground and string select lines GSL and SSL may include two or more conductive lines that are stacked.

The conductive patterns 201~206 may be formed of any of a variety of conductive materials. For example, the conductive patterns 201~206 may include at least one of doped semiconductor, metals, metal nitrides and metal silicides. The conductive patterns 201~206 may be rectilinear patterns aligned transverse to crossing bit lines 260. The conductive patterns 201~206 may control an electrical connection between the bit line 260 and the common source line CSL by controlling an electric potential of a semiconductor pattern 300.

The semiconductor patterns 300 pass through the interconnection structures 200 to contact the substrate 100. Data storage layers 230 may be disposed between the semiconductor patterns 300 and the conductive patterns 201~206. Electrode separation patterns 250 may be disposed between horizontally adjacent ones of the interconnection structures 200, such that the horizontally adjacent conductive patterns 201~206 are electrically insolated from one another. Each bit line 260 crossing the conductive patterns 201~206 is connected with a plurality of the semiconductor patterns 300.

The semiconductor patterns 300 may, for example, have a pillar shape as illustrated in FIG. 2 or a hollow cylindrical shape as illustrated in FIG. 4. The insides of the semiconductor patterns 300 of FIG. 4 having a hollow cylindrical shape may be filled with buried insulating patterns 350. In some embodiments, semiconductor patterns 300 may have a linear shape crossing sidewalls of the conductive patterns 201~206 as illustrated in FIG. 5.

The semiconductor patterns 300 may serve as part of MOS capacitors by capacitive coupling to the conductive patterns 201~206. In such embodiments, voltages applied to the conductive patterns 201~206 can variably control an electric potential of the semiconductor patterns 300 adjacent to the conductive patterns 201~206. An energy band of a semiconductor pattern 300 can be inverted according to a voltage applied to the conductive patterns 201~206. Thus, an electrical connection between the bit line 260 and the common source line (the impurity region 102) may be controlled by voltages applied to the conductive patterns 201~206. The semiconductor patterns 300 may further include an impurity region D having a different conductivity type from the semiconductor pattern 300.

The semiconductor patterns 300 may have an amorphous structure, a single crystalline structure and/or a polycrystalline structure. Charge mobility in the semiconductor pattern 300 used as a transistor channel may be changed by a size of grains in the semiconductor pattern 300. If the semiconductor patterns 300 have a polycrystalline structure, the semiconductor patterns 300 may have relatively small grains and a relatively large number of grain boundaries. A large number of grain boundaries may impede charge movement. If the semiconductor patterns 300 are polysilicon and formed using a chemical vapor deposition (CVD) process, sizes of the grains may be non-uniform.

In some embodiments of the inventive subject matter, the semiconductor patterns 300 may be formed to have a graded crystalline structure such that lower portions of the semiconductor patterns 300 may have a different crystalline structure than upper portions of the semiconductor patterns 300. For example, as shown in FIG. 3, each of the semiconductor patterns 300 may include a lower region 312 and an upper region 320. The lower semiconductor region 312 may be adjacent to the conductive line 201, which is used as a ground select line, and the upper semiconductor region 320 may be adjacent the conductive patterns 202~206 used as word lines and a string select line.

The lower semiconductor region 312 adjacent to the substrate 100 may be, for example, an amorphous semiconductor layer or a polycrystalline semiconductor layer and the upper semiconductor region 320 may include, for example, polycrystalline semiconductor material having a mean grain size that is greater than that of the lower semiconductor region 312. For example, the lower semiconductor region 312 and the upper semiconductor region 320 may both include polycrystalline semiconductor material, but a mean grain size of the polycrystalline material of the upper semiconductor region 320 may be larger than that in the lower semiconductor region 312. In some embodiments, the lower semiconductor region 312 may include an amorphous silicon material and the upper semiconductor region 320 may include a polycrystalline silicon material.

According to some embodiments, the upper semiconductor region 320 may include semiconductor material recrystallized using a laser annealing process. When an amorphous semiconductor material or a polycrystalline semiconductor material is recrystallized after being melted, grains may be grown from a lower portion of the melted material to form the upper semiconductor region 320. As a result, a mean grain size in an upper portion of the upper semiconductor region 320 adjacent to a top surface of the interconnection structure 200 may be greater than that in a lower portion of the upper semiconductor region 320 adjacent to the lower semiconductor region 312. The upper semiconductor region 320 may include grains vertically and horizontally grown from a top surface of the lower semiconductor region 312 and a mean grain size in an upper portion of the upper semiconductor region 320 may be larger than that in a lower portion of the upper semiconductor region 320. Generally, the mean grain size in the upper semiconductor region 320 may increase with the distance from the substrate 100.

Since the crystalline structure and mean grain size in the lower and upper portions of the semiconductor patterns 300 are different, an interface may be formed between the lower semiconductor region 312 and the upper semiconductor region 320. It may be advantageous for portions of the semiconductor pattern 300 used as channels of the memory cells to include large grains, it may be desirable for the interface between the lower semiconductor region 312 and the upper semiconductor region 320 to be disposed between the ground select line 201 and the lowest word line 202 layer.

As illustrated in FIGS. 4 and 5, hollow cylindrical shaped or are U-shaped semiconductor patterns 300 may also each include a lower semiconductor region 312 and an upper semiconductor region 320 having different crystalline structures. For example, the lower semiconductor regions 312 may include an amorphous semiconductor or polycrystalline semiconductor material and the upper semiconductor region 320 may include a polycrystalline semiconductor pattern. A mean grain size in the upper semiconductor regions 320 may be larger than a mean grain size in the lower semiconductor regions 312. Along the lines discussed above, the mean grain size in the upper semiconductor regions 320 may also increase with distance from the substrate 100.

Data storage layers 230 may be disposed between the conductive patterns 201~206 and the semiconductor patterns 300. The data storage layers 230 may each include, for example, a trap insulating layer, a floating gate electrode and/or conductive nanodots. The data storage layers 230 may extend on top and bottom surface of the conductive patterns 201~206 between the conductive patterns 201~206 and the semiconductor pattern 300. The data storage layers 230 may be interposed between top surfaces of the conductive patterns 201~206 and the interlayer insulating layers 211~216 and between bottom surfaces of the conductive patterns 201~206 and the interlayer insulating layers 211~216.

The data storage layers 230 may each include a charge storage layer and data stored in the data storage layers 230 can be changed using a F-N tunneling caused by a voltage difference between the semiconductor patterns 300 and the conductive patterns 201~206. In some embodiments, the storage layers 230 may thin data storage layers, such as thin layers used for phase change memory or variable resistance memory that can store data based on a different operational principle than charge trapping.

Figure 6:
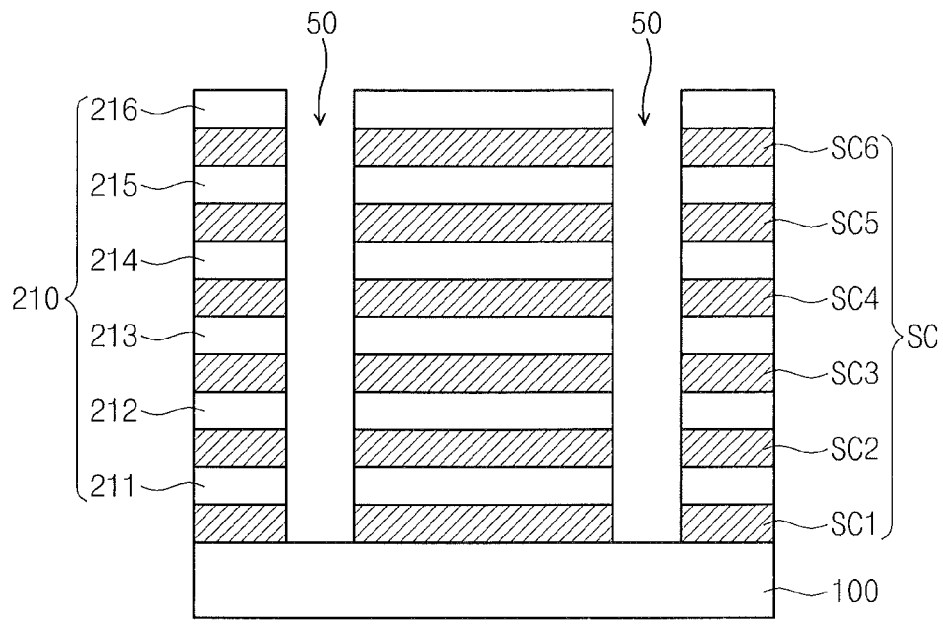
FIGS. 6 through 12 are drawings illustrating a method of manufacturing a three dimensional semiconductor memory device in accordance with some embodiments of the inventive subject matter.

Hereinafter, referring to FIGS. 6 through 12, operations for manufacturing three-dimensional semiconductor memory devices according to some embodiments of the inventive subject matter will be described. Referring to FIG. 6, a thin layer structure is formed on a substrate 100. The substrate 100 may include any of a variety of semiconductor materials, an insulating material (e.g., glass), a semiconductor covered with an insulating material, and/or a conductive material.

The thin layer structure may include a plurality of interlayer insulating layers 210 (211~216) and a plurality of sacrificial layers SC (SC1~SC6). As illustrated in FIG. 6, the interlayer insulating layers 210 and the sacrificial layers SC may be alternately stacked. The interlayer insulating layers 210 and the sacrificial layers SC may include selected materials having an etching selectivity. For example, the interlayer insulating layers 210 may be at least one of a silicon oxide layer and a silicon nitride layer and the sacrificial layers SC may be one or layers of a different material than the interlayer insulating layers 210, such as a silicon layer, a silicon oxide layer, a silicon carbide and/or a silicon nitride layer.

A conductive region may be formed on or in the substrate 100 before forming the thin layer structure. If the substrate 100 is a semiconductor material, for example, the conductive region may be an impurity region formed in the substrate 100. If the substrate 100 is an insulating material, the conductive region may be a conductive layer or a conductive pattern disposed on the substrate 100. According to some embodiments, the conductive region may be used as a common source line.

Subsequently, the thin layer structure is patterned to form a plurality of first openings 50 that expose a top surface of the substrate 100. In some embodiments, each of the first openings 50 may have a cylindrical shape or a rectangular parallelepiped shape. The width of the first openings 50 may vary with distance from the substrate 100, e.g., the first openings may have sloping sidewalls.

Forming the first openings 50 may include forming a mask pattern (not illustrated) on the thin layer structure and anisotropically etching the thin layer structure using the mask pattern as an etching mask. The first openings 50 may be arrayed in two dimensions at regular intervals. For example, a location of the first openings 50 may be represented by a coordinate set of (x0+n*a, y0+m*b) (x0 and y0 are coordinates of a reference point, n and m are natural numbers selected within a cell array size and a and b are constants). The width of the first openings 50 may vary according to a distance from the substrate 100 dues to etching effects. According to some embodiment, each of the first openings 50 may have a linear shape or a stripe shape.

Semiconductor patterns 300 are formed in the first opening 50, as will now be described with reference to FIGS. 7 and 8. The semiconductor patterns 300 directly contact the substrate 100 or a top surface of the conductive region. The semiconductor patterns 300 may include a semiconductor material formed using an epitaxial process or a chemical vapor deposition process. A crystalline structural discontinuous interface may be formed in each of the semiconductor regions 300.

In some embodiments, the semiconductor patterns 300 may have a pillar shape filling the first openings 50 and conform to inner walls of the first openings 50. In further embodiments, the semiconductor patterns 300 may have a hollow cylindrical shape and may conform to inner walls of the first openings 50.

The semiconductor patterns 300 may have amorphous, monocrystalline and/or polycrystalline structure. Many grain boundaries may exist in the semiconductor pattern 300 because the semiconductor pattern 300 of a polycrystalline structure is comprised of many grains. As a size of a grain decreases, the number of grain boundaries increases and thereby a movement of charges may be disturbed when a semiconductor memory device operates. Thus, to increase mobility of charges in the semiconductor pattern 300, it is desirable that a size of the grains in the semiconductor pattern 300 is large.

If a size of grains in the semiconductor pattern 300 becomes large, charge mobility in the semiconductor pattern 300 may increase because the number of grain boundaries decreases. In the case that the semiconductor pattern 300 is formed using a chemical vapor deposition (CVD) process, a size of grains is non-uniform and thereby an electrical characteristic of a semiconductor memory device may be deteriorated. Accordingly, the semiconductor pattern 300 comprised of grains of a uniform size is required.

To achieve this, some embodiments involve forming the semiconductor patterns 300 by forming precursor semiconductor patterns 310, phase-changing the precursor semiconductor patterns 310 and recrystallizing the phase-changed precursor semiconductor pattern 310 to form the semiconductor patterns 300.

Figure 7:
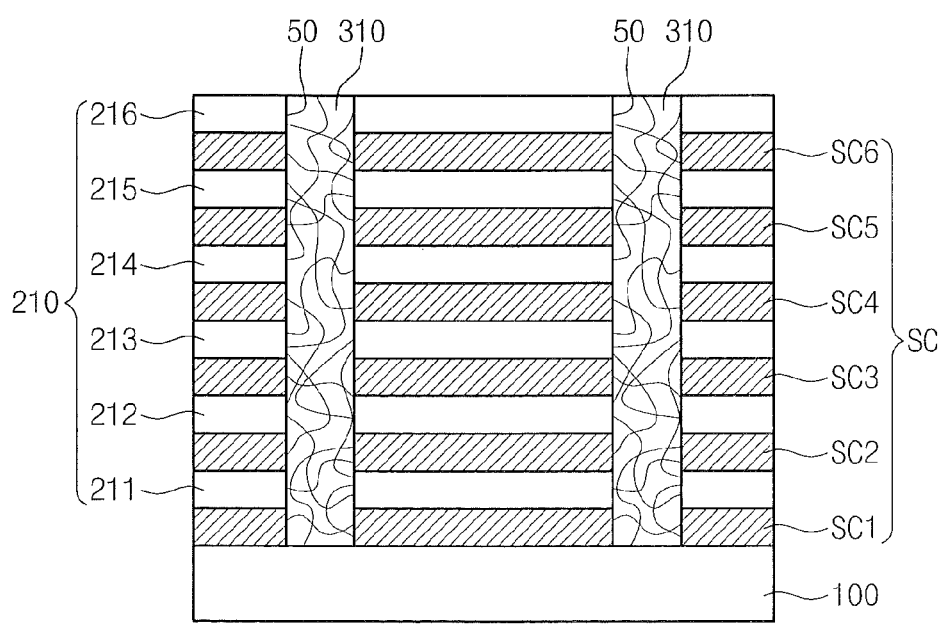

Referring to FIG. 7, precursor semiconductor patterns 310 may be formed to directly contact the substrate 100 or a top surface of a conductive region on the substrate. The precursor semiconductor patterns 310 may be formed in the first openings 50 using a chemical vapor deposition process or an atomic layer deposition process. The precursor semiconductor patterns 310 may be formed, for example, by depositing an amorphous semiconductor layer or a polycrystalline semiconductor layer including silicon, germanium or combinations thereof. For example, an amorphous silicon layer or a polycrystalline silicon layer can be used to form the precursor semiconductor patterns 310. A discontinuous interface may be formed in the precursor semiconductor patterns 310 by creating different crystal structures in the precursor semiconductor patterns 310.

The precursor semiconductor pattern 310 may completely fill the first openings 50 as illustrated in FIG. 7. Alternatively, the precursor semiconductor pattern 310 may conform to inner walls of the first openings 50 as illustrated in FIG. 4 and have a hollow cylindrical shape.

For hollow cylindrical shaped precursor semiconductor patterns 310 as illustrated in FIG. 4, buried insulating patterns 350 may be formed inside of the precursor semiconductor patterns 310. The buried insulating patterns 350 may include any of a number of different insulating materials. For example, the buried insulating patterns 350 may be silicon oxide or spun on glass (SOG). For example, the buried insulating patterns 350 may be a CVD-oxide layer, a PE-oxide layer or a SOG layer.

Figure 8:
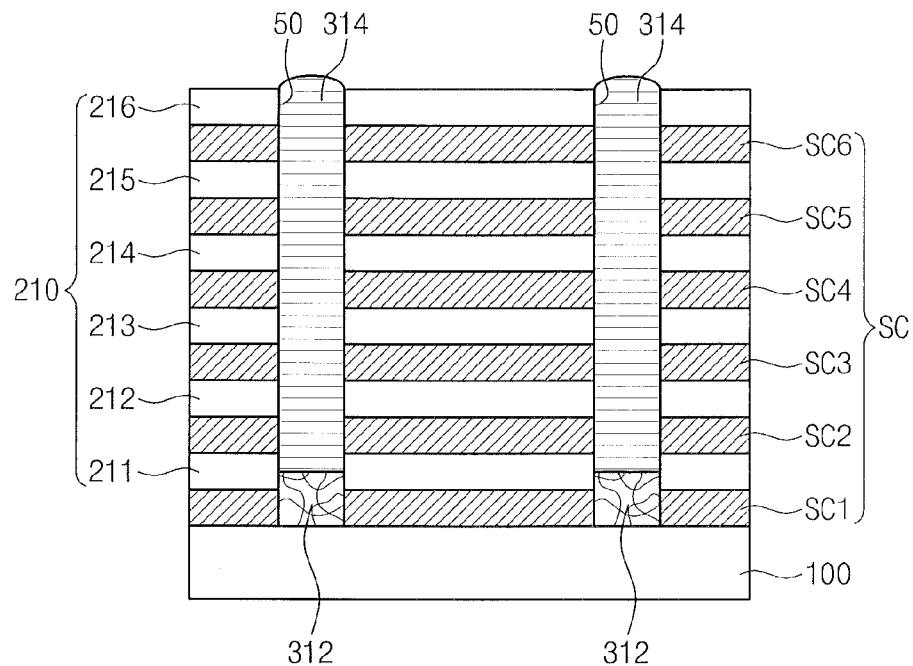

Referring to FIG. 8, liquid state semiconductor regions 314 are formed by phase-changing portions of the precursor semiconductor pattern 310 in the first opening 50. For example, a laser annealing process may be used to melt upper portions of the precursor semiconductor patterns 310 to change these portions to a liquid state. The laser annealing process may be performed by irradiating upper surfaces of the precursor semiconductor patterns 310 using a laser beam having enough energy density to melt upper portions of the precursor semiconductor patterns 310. For example, an excimer laser or an argon (Ar) laser may be used. The laser annealing process may be performed in a relatively short time of 30~200 nanoseconds. The laser energy density may vary depending, for example, on the height of the precursor semiconductor patterns 310, a frequency of the laser beam, an annealing time, a deposition condition or process used to form the precursor semiconductor patterns 310 and a temperature of the substrate 100. The laser energy density, beam profile, number of laser beam pulses, substrate temperature and deposition conditions and process may affect a crystallinity of the upper semiconductor region 320.

When a laser beam irradiates top surfaces of the precursor semiconductor patterns 310, the laser beam is absorbed into the precursor semiconductor patterns 310 and thereby portions of the precursor semiconductor patterns 310 may be phase-changed into a liquid state. An energy density applied to the precursor semiconductor patterns 310 may be reduced nearer the substrate 100. Therefore, the precursor semiconductor patterns 310 may be partially melted. Thus, untransformed semiconductor regions 312 having a solid state remains and interfaces formed between the melted semiconductor regions and the untransformed regions 312.

It may be desirable that grain size in portions of the semiconductor patterns 300 to be used as channels of memory cell transistors be larger than a grain size in portions used as channels of select transistors. Thus, when performing a laser annealing process, a laser energy density may be controlled so that the precursor semiconductor patterns 310 are phase-changed to location near the sacrificial layer SC1 located at the lowest layer. The laser beam energy may be controlled so that the precursor semiconductor patterns 310 melt up to a location adjacent the ground select transistors. The laser beam energy can be controlled so that an interface between the melted semiconductor regions 314 and the untransformed regions 312 is below a top surface of the sacrificial layer SC1. The laser annealing process may be performed so that the portions of the precursor semiconductor patterns 310 that are not phase-changed are below the word line 202 to be formed in a subsequent process.

In some embodiments, if a ground select line is formed of a plurality of stacked conductive patterns, laser energy density may be controlled so that the precursor semiconductor patterns 310 melt down to a location below a location at which a ground select line is to be formed. The laser energy density may be varied according to a height of the precursor semiconductor pattern 310, a frequency of a laser beam, an annealing time, a deposition condition and a deposition process used to form the precursor semiconductor patterns 310 and/or a temperature of the substrate 100.

Figure 9:
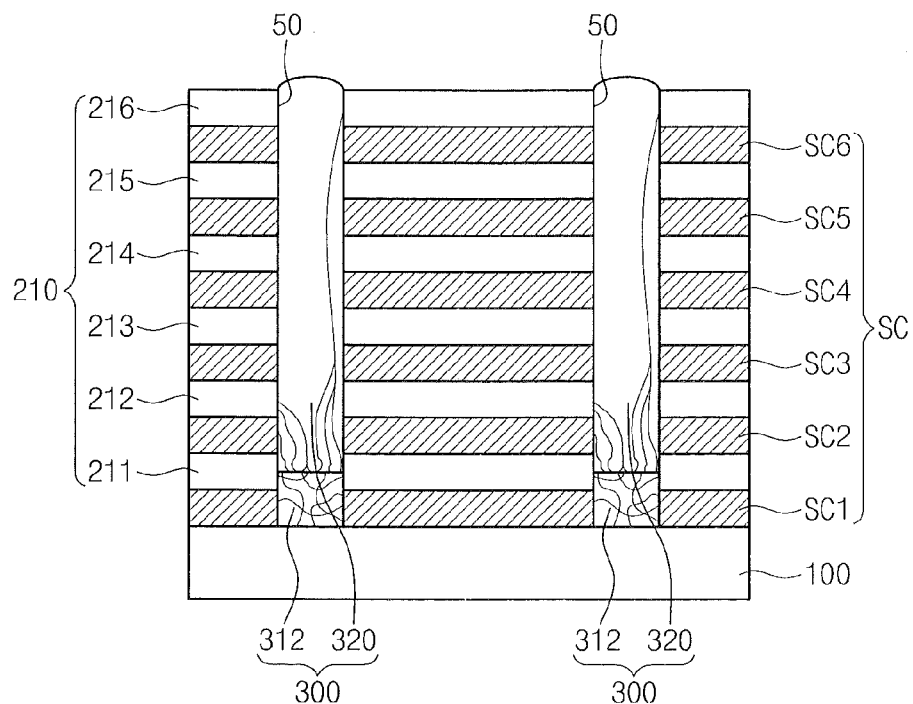

Referring to FIG. 9, after phase-changing upper portions of the precursor semiconductor patterns 310 to a liquid state, the melted semiconductor regions 314 are cooled to cause recrystallization. As a result, upper semiconductor regions 320 having a mean grain size larger than a mean grain size of lower semiconductor regions 312 may be formed. For example, the melted semiconductor regions 314 may be cooled using a super-cooling process to generate grain nucleuses and the grain nucleuses can grow vertically and horizontally. The phase-changed semiconductor regions 314 can be supercooled at a temperature lower than a melting point of the semiconductor material. If the semiconductor regions 314 are cooled and thereby solidification begins, grains grow in an upper direction with a grain nucleus as a center and thereby the upper semiconductor regions 320 may be formed. A size of grains in the upper semiconductor regions 320 may vary according to the laser energy density used in the melting process and/or a cooling speed. The upper semiconductor regions 320 can be polycrystalline semiconductor having comparatively large grains.

The recrystallized upper semiconductor regions 320 may have a different mean grain size than that of the lower semiconductor region 312. A mean grain size of the upper semiconductor regions 320 may be larger than a mean grain size of the lower semiconductor regions 312. A mean grain size of the upper semiconductor regions 320 may increase with distance from the substrate 100. Thus, portions of the upper semiconductor regions 320 adjacent to tops of the first openings 50 may be single crystal.

When the melted semiconductor regions 314 are cooled, latent heat may cause a secondary melting of the lower semiconductor regions 312, with these melted portions of the lower semiconductor region 312 subsequently cooling to return to a solid state. A grain size of the portions of the lower semiconductor regions 312 which are secondary-melted and recrystallized may be smaller than a grain size of the upper semiconductor pattern 320.

Figure 10:
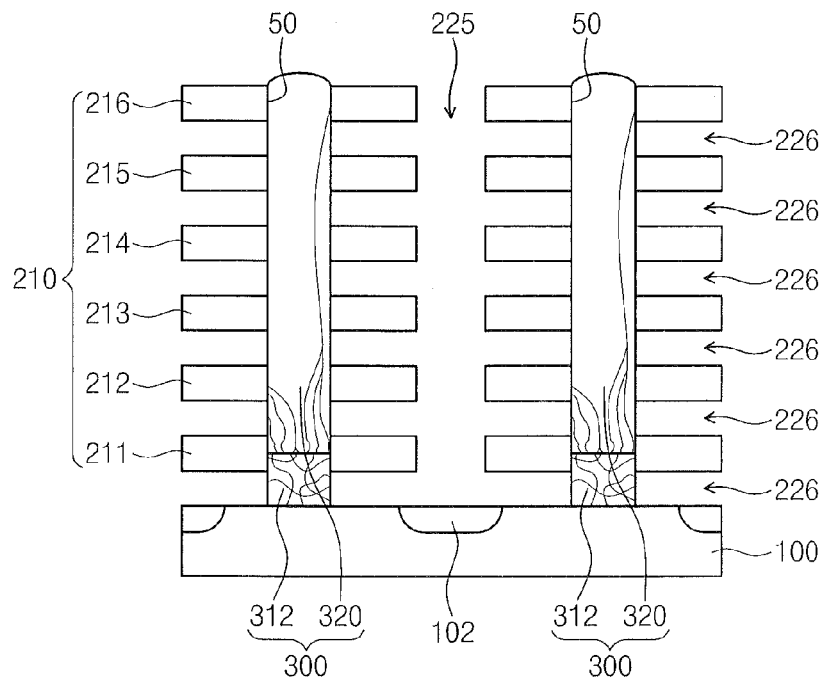
Figure 11:
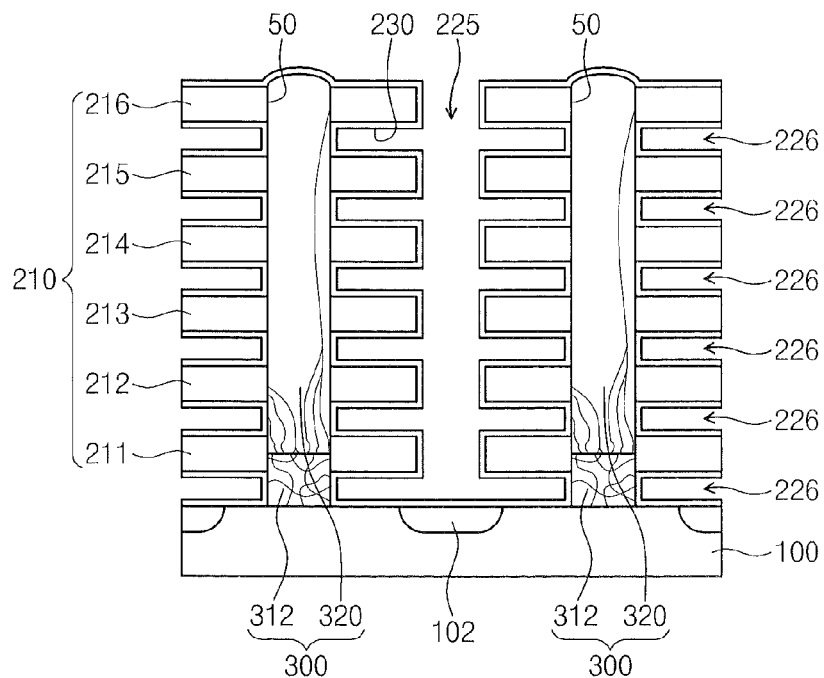
Figure 12:
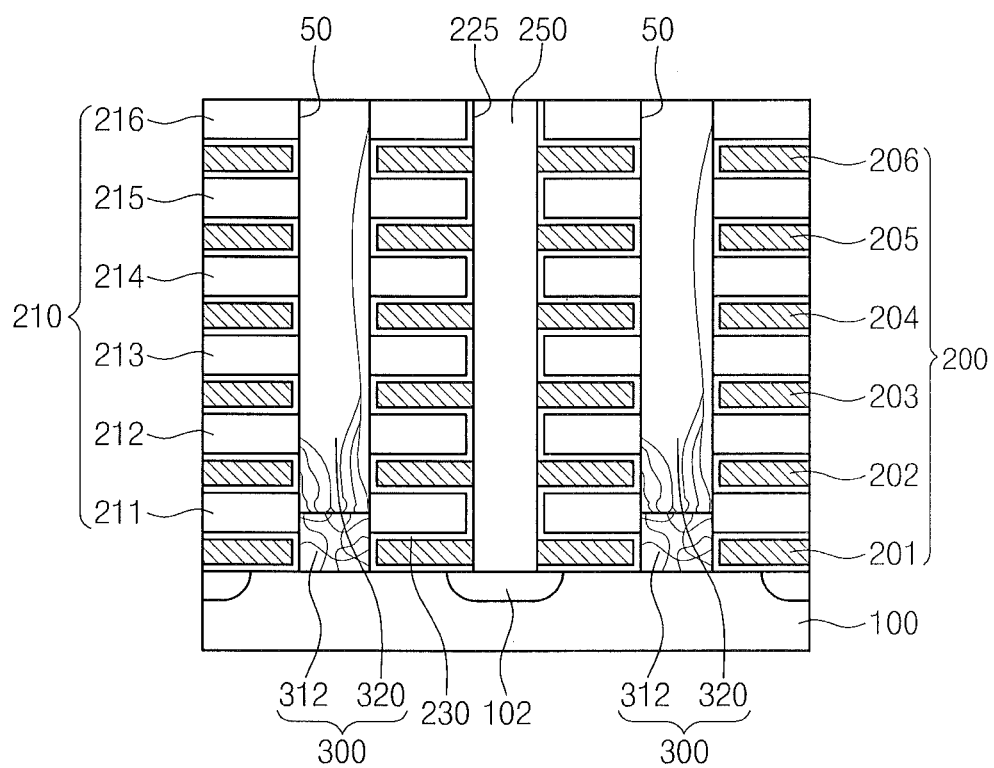

According some embodiments, a solid phase crystallization (SPC) process, a metal induced crystallization (MIC) process or a rapid thermal annealing (RTA) process may be used to form semiconductor patterns 300 by recrystallizing the precursor semiconductor patterns 310. Referring to FIGS. 10 through 12, after forming the semiconductor patterns 300 including upper and lower semiconductor regions 320, 312, an interconnection structures 210 including conductive patterns 201~206 that are vertically stacked and horizontally face each other are formed.

Forming the interconnection structures 210 may include forming a second opening 225 penetrating a portion or an entire portion of thin layers constituting the thin layer structure between the semiconductor patterns 300 and replacing sacrificial layers of the thin layer structure with conductive material layers.

As illustrated in FIG. 10, the second opening 225 is spaced apart from the semiconductor patterns 300 to expose sidewalls of the sacrificial structure SC and the interlayer insulating structure 210. The second opening 225 may be formed to have a linear or rectangular shape. The second opening 225 may expose a top surface of the lowest layer among the sacrificial layers SC1~SC6. According to some embodiments, a conductive region (not illustrated) which can be used as a common source line may be locally formed in the substrate 100 disposed under the second opening 225. The conductive region may be formed by an ion implantation process using the thin layer structure including the second opening 225 as an ion mask.

Replacing the sacrificial layers may include forming recesses 226 between the interlayer insulating layers 210 by selectively removing the sacrificial layers SC of which sidewalls are exposed by the second opening 225 as illustrated in FIG. 10. Data storage layers 230 and conductive patterns 201~206 are formed inside the recesses 226 as illustrated in FIGS. 11 and 12.

The recesses 226 may be gap regions horizontally extending between the interlayer insulating layers 210 from the second opening 225 and may be formed to expose sidewalls of the semiconductor patterns 300. Forming the recesses 226 may include isotropically etching the sacrificial layers using an etching recipe having an etching selectivity with respect to the interlayer insulating layers 210. For example, in the case that the sacrificial layers SC are silicon nitride and the interlayer insulating layers 210 are silicon oxide layer, the sacrificial layers SC may be etched using an etching solution including phosphoric acid.

Forming the data storage layers 230 and the conductive patterns 200 (201~206) as shown in FIG. 12 may include forming the data storage material layer that conforms to the recesses 226, forming a conductive layer on the data storage material layer and in the second opening 225, and removing portions of the conductive layer in the second opening 225 to leave the data storage layers 230 and the conductive patterns 200 (201~206).

The data storage material layer may be formed using a deposition process (for example, a chemical vapor deposition process or an atomic layer deposition process) having a superior step coverage characteristic. A thickness of the data storage material layer may be less than half of the thickness of the recesses 226. Thus, the data storage material layer may conform to surfaces within the recesses 226. In some embodiments, the data storage layers 230 may include a charge storage layer. For example, the data storage layers 230 may include a trap insulating layer, a floating gate electrode and/or conductive nanodots.

According to some embodiments, the data storage layers 230 may include a blocking insulating layer, a charge storage layer and a tunnel insulating layer that are sequentially stacked. The blocking insulating layer may include at least one of a silicon oxide layer, a silicon nitride layer, a silicon oxynitride layer and a high dielectric layer and may include a plurality of layers. A high dielectric layer means insulating materials having a higher dielectric constant than a silicon oxide layer and may include a tantalum oxide layer, a titanium oxide layer, a hafnium oxide layer, a zirconium oxide layer, an aluminum oxide layer, a yttrium oxide layer, a niobium oxide layer, a cesium oxide layer, an indium oxide layer, an iridium oxide layer, a BST layer and a PZT layer. The tunnel insulating layer may include a material having a lower dielectric constant than the blocking insulating layer and the charge storage layer may be an insulating thin layer (e.g., a silicon nitride layer) having an abundant charge trap sites or may be an insulating thin layer including conductive grains. According to some embodiments, the tunnel insulating layer may be a silicon oxide layer, the charge storage layer may be a silicon nitride layer and the blocking insulating layer may be an insulating including an aluminum oxide layer.

A conductive layer may be formed to fill the recesses 226 and the second opening 225 that are covered with the data storage layer 230. The conductive layer may include, for example, at least one of doped silicon, tungsten, metal nitride layers and metal silicide. Since a technical spirit of the inventive subject matter is not limited to flash memory devices, the data storage layers 230 and the conductive layer may have various materials and structures.

As illustrated in FIG. 12, an electrode separating pattern 250 may be formed in the second opening 225. The conductive patterns 201~206 form interconnection structure 200.

Removing the conductive layer in the second opening 225 may include anisotropically etching the conductive layer using the highest insulating layer SC as an etching mask or a hard mask pattern (not illustrated) which is further formed on a top surface of the highest insulating layer SC as an etching mask. Removing the conductive layer in the second opening 225 forms the conductive patterns 201~206 vertically separated from each other. The conductive patterns 201~206 may be locally formed in the recesses 226 and may constitute the interconnection structure 200.

Forming the electrode separating pattern 250 may include filling the second opening 225 with any of a variety of insulating materials. According to some embodiments, the electrode separating pattern 250 may be at least one of a silicon oxide layer, a silicon nitride layer and a silicon oxynitride layer.

According to some embodiments, before forming the electrode separating pattern 250, an impurity region 102 may be formed in the substrate 100. The impurity region 102 may have a different conductivity type than the substrate 100 and may be used as the common source line CSL described with reference to FIG. 1.

Referring back to FIG. 3, a contact pads D may be formed in upper portions of the semiconductor patterns 300. Bit lines BL electrically connecting the semiconductor patterns 300 may be formed. The bit lines BL may be formed along a direction crossing the second opening 225 or the interconnection structure 200 as illustrated in FIG. 3. The bit lines BL may be connected to the semiconductor patterns 300 by a contact plug (not illustrated).

Figure 13:
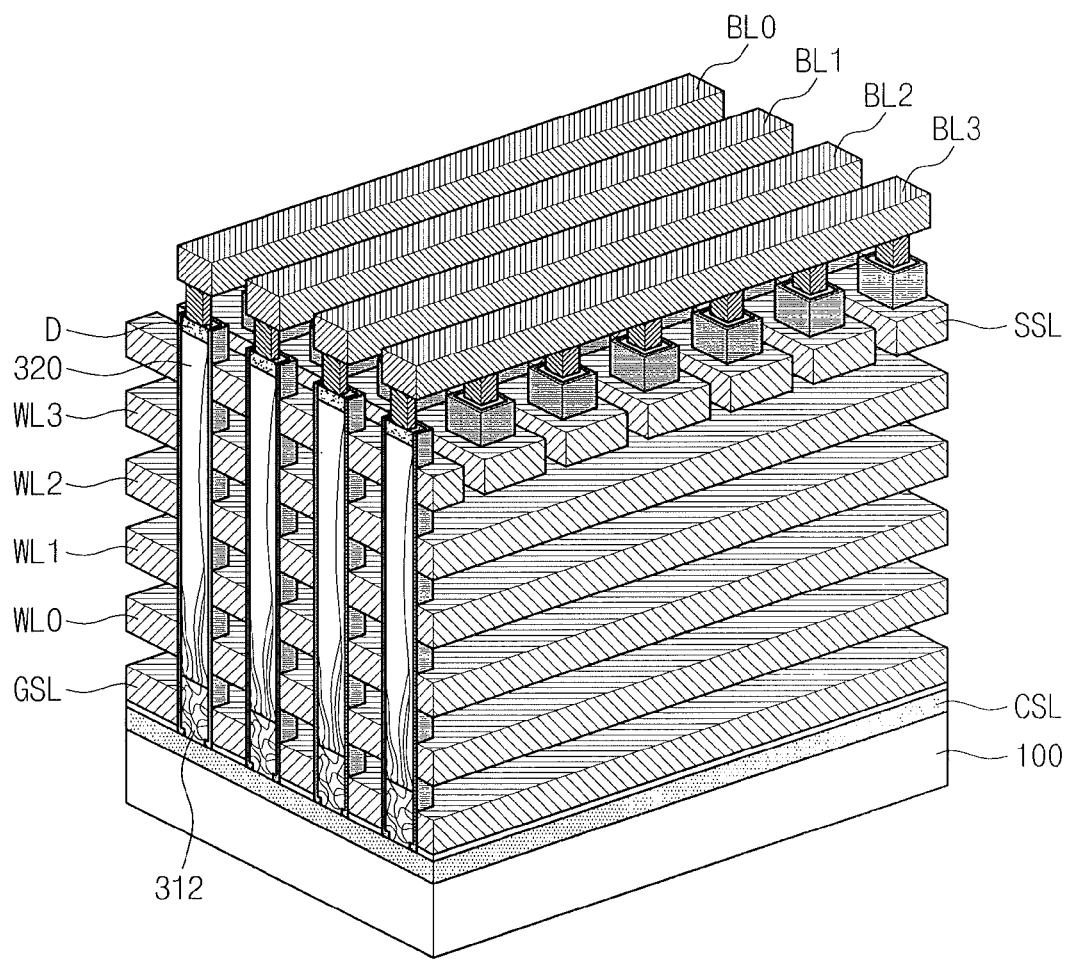
FIG. 13 is a perspective view illustrating a three dimensional semiconductor memory device in accordance with another embodiment of the inventive subject matter.
Figure 14:
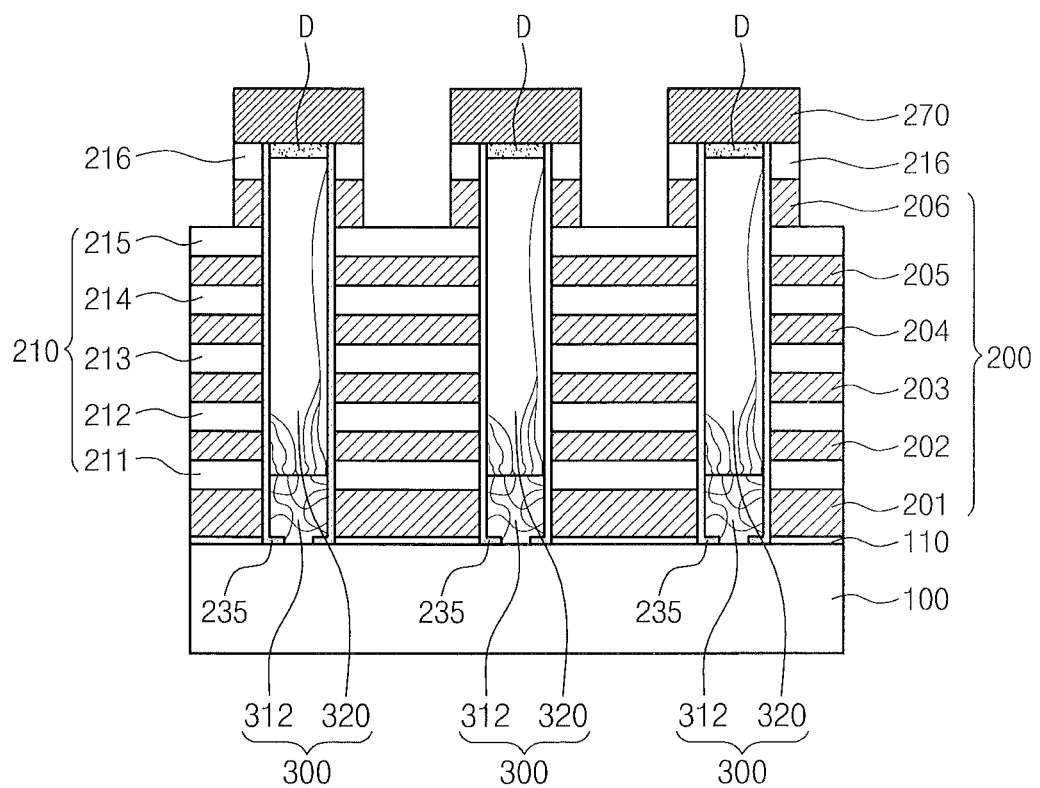
FIG. 14 is a cross sectional view illustrating a three dimensional semiconductor memory device in accordance with another embodiment of the inventive subject matter.

Hereinafter, referring to FIGS. 13 through 18, operations for fabricating a three-dimensional semiconductor memory device in accordance with further embodiments are described in detail. FIGS. 13 and 14 are a perspective view and a cross sectional view, respectively, illustrating a three dimensional semiconductor memory device.

Referring to FIGS. 13 and 14, in a three-dimensional memory device in accordance with another embodiment, conductive patterns having a plate shape are formed. A ground select line GSL and each of word lines WL0~WL3 may have a plate shape aligned parallel to a top surface of the substrate 100.

Semiconductor patterns 300 may be formed which pass through the conductive patterns GSL and WL0~WL3. According to some embodiments, data storage layers 235 may be formed to cover sidewalls of the semiconductor patterns 300. The semiconductor patterns 300, as described with reference to FIGS. 2 and 3, may include a lower semiconductor region 312 and an upper semiconductor region 320. The upper semiconductor regions 320 may be melted and recrystallized by a laser annealing process and may have a different crystalline structure than the lower semiconductor region 312. A mean grain size of the upper semiconductor regions 320 may be larger than a mean grain size of the lower semiconductor regions 312.

Figure 15:
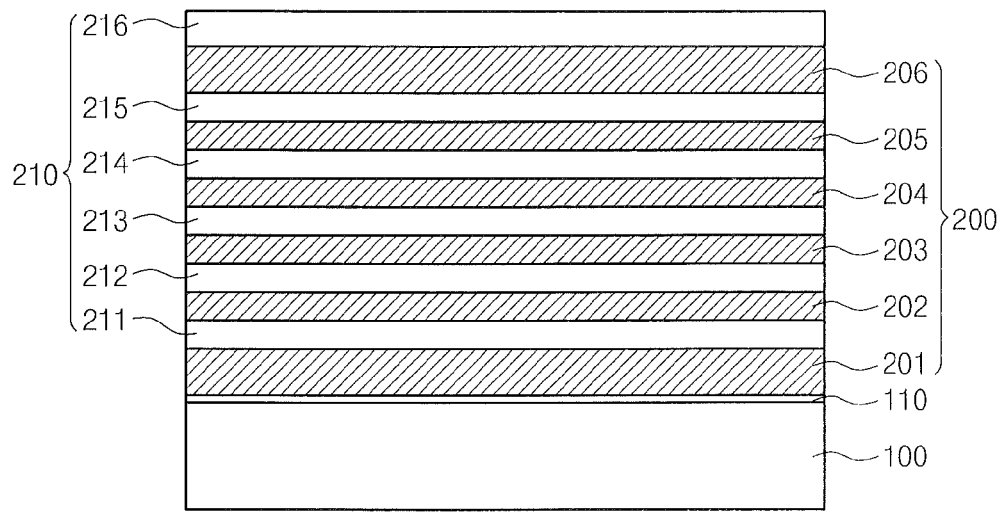
FIGS. 15 through 18 are drawings illustrating a method of manufacturing a three dimensional semiconductor memory device in accordance with another embodiment of the inventive subject matter.

FIGS. 15 through 18 are drawings illustrating operations for fabricating a three dimensional semiconductor memory device in accordance with additional embodiments of the inventive subject matter. Referring to FIG. 15, a thin layer structure is formed on a lower gate insulating layer 110 and a substrate 100 using, for example, operations similar to those described with reference to FIG. 6. The substrate 100 may include a cell array region in which memory cells are formed and a peripheral circuit region in which peripheral circuits for operating memory cells are formed.

The lower gate insulating layer 110 may be a silicon oxide layer formed through a thermal oxidation process and may have a thickness of about 40~300 angstroms. A flash memory device may include gate insulating layers having various thickness and materials and methods of forming the gate insulating layers are well established. The lower gate insulating layer 110 may be formed using any of a number of different techniques for forming a gate insulating layer of a flash memory device. The lower gate insulating layer 110 may be used as a capacitor dielectric layer.

The thin layer structure may include a lower gate layer 201, middle gate layers 202~205 and an upper gate layer 206, with interlayer insulating layers 211~216 interposed between the lower, middle and upper gate layers 201~206. The lower, middle and upper gate layers 201~206 form a constitute an upper gate structure 200 and interlayer insulating layers 211~216 interposed between the lower, middle and upper gate layers 201~206 form an interlayer insulating structure 210.

The lower gate layer 201 is formed from a conductive material so as to be used as a gate electrode. For example, the lower gate layer 201 may be formed from doped polycrystalline silicon. The lower gate layer 201 may be used as a ground select line GSL as described with reference to FIG. 1.

The middle gate layers 202~205 may be used as word line plates (WL_PT) and the upper gate layer 206 may be used as a string select line SSL. Thus, as described above, a space between the middle gate layers 202~205 (i.e., a thickness of the gate interlayer insulating layers 211~216) may be formed to be smaller than a maximum width of an inversion region formed in the semiconductor pattern 300. The middle and upper gate layers 202~206 are formed from a conductive material so as to be used as gate electrodes. In some embodiments, the ground select line GSL and the string select line SSL may include a plurality of gate layers.

Because the middle gate layers 202~205 are used as gates for the memory cell transistors, a thickness of the middle gate layers 202~205 determines a channel length of the memory cell transistors. Because the middle gate layers 202~205 may be formed through a deposition process, a channel length can be more precisely controlled compared with the case that the middle gate layers 202~205 are formed through a patterning process. Because the channels of the memory cell transistors are perpendicular to the substrate 100, an integration of the semiconductor memory device in accordance with the inventive subject matter is independent of a thickness of the middle gate layers 202~205. Therefore, the middle gate layers 202~205 may be selected so as to reduce a short channel effect.

The gate interlayer insulating layers 211~216 may be formed from a silicon oxide layer. A creation of the inversion region due to an electric potential applied to the middle gate layers may be controlled by a fringe field (FF) due to voltages applied to the gate conductive layers. The gate interlayer insulating layers 211~216 may further include high dielectric layers to easily create the inversion region. The high dielectric layer may include, for example, a silicon nitride layer or a silicon oxynitride layer having a higher dielectric constant than a silicon oxide layer.

The number of thin layers in the upper gate structure 200 and the interlayer insulating structure 210, a thickness of the thin layer and material of the thin layer may be varied based on desired electrical characteristic of the memory cell transistors and limitations of the process used to pattern the thin layers.

Figure 16:
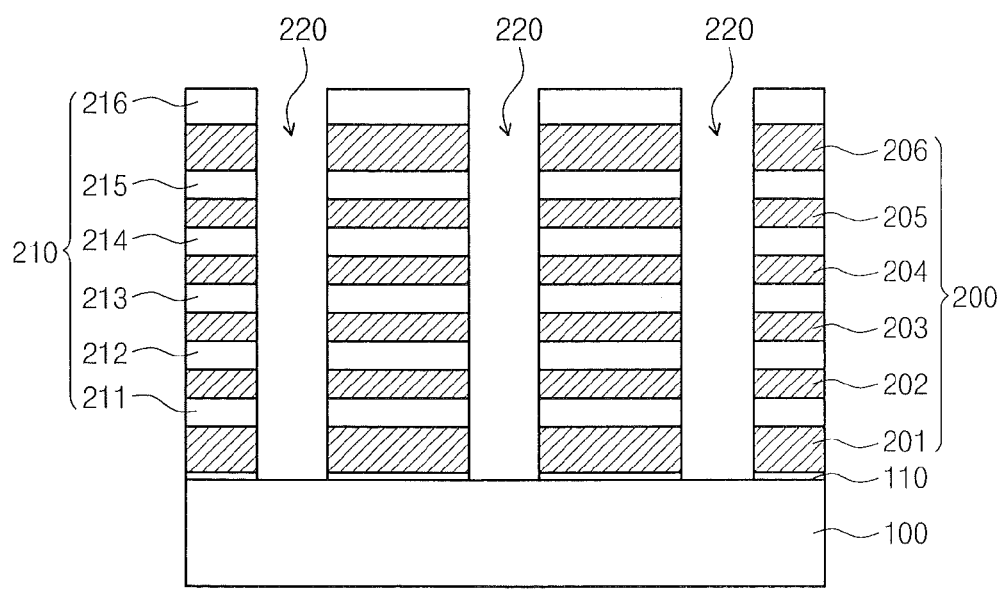

Referring to FIG. 16, the upper gate structure 200 and the interlayer insulating structure 210 are patterned to form openings 220 exposing a top surface of the substrate 100 in the cell array region. If sidewalls of the openings 220 are sloped, channel widths of the memory cell transistors may vary and electrical characteristics of the memory cells may be nonuniform. To reduce nonuniformity of electrical characteristics, an anisotropic etching process may be used so that the openings 200 have substantially vertical sidewalls. According to a some embodiments, to improve uniformity of an electrical characteristic between the cells, the middle gate layers 202~205 may have different thicknesses.

Figure 17:
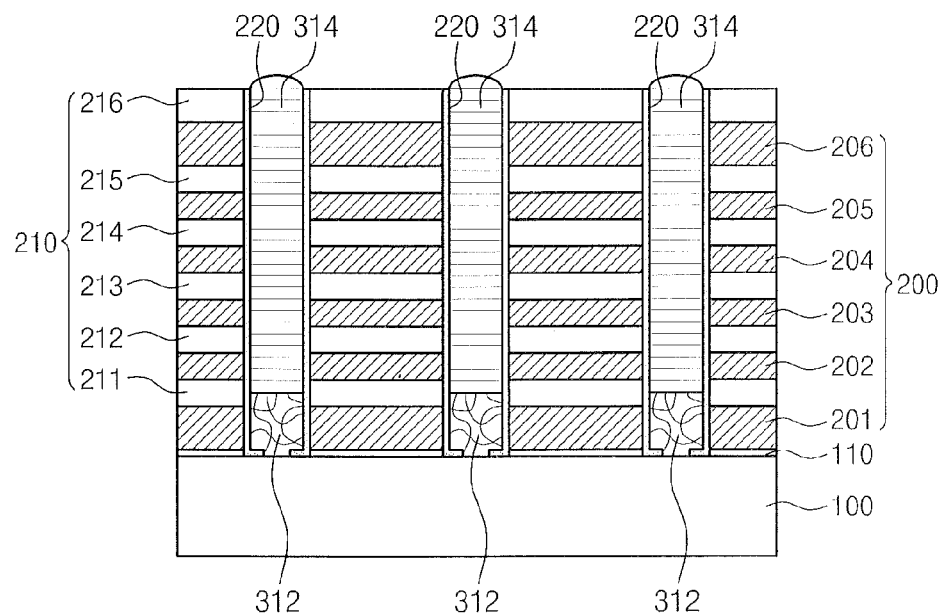

Referring to FIG. 17, a gate insulating layer (235, i.e., a data storage layer) is formed on the structure including the openings 220. The gate insulating layer 235 may be, for example, at least one of a silicon oxide layer, a silicon nitride layer and a silicon oxynitride layer. The gate insulating layer 235 may include a thin layer for data storage. For example, the gate insulating layer 235 may include a blocking insulating layer, a charge storage layer and a tunnel insulating layer that are sequentially stacked. The charge storage layer may be a silicon nitride layer or a silicon oxynitride layer having charge trap sites and may be used as a thin layer for data storage. The tunnel insulating layer may be a thermal oxidation layer or a chemical vapor deposition silicon oxide layer and the blocking insulating layer may include any of a number of different materials having a higher dielectric constant than the tunnel insulating layer. The blocking insulating layer, the charge storage layer and the tunnel insulating layer may be formed using conventional technologies or modifications thereof.

As described above, the substrate 100 is electrically connected to the semiconductor patterns 300 filling the openings 220. Spacers may be formed in the opening 220 as an etching mask for patterning the gate insulating layer 235. The spacers may cover an inner wall of the gate insulating layer 235 in the opening 220 to reduce an etching damage with respect to the gate insulating layer 235 in a subsequent patterning process etching the gate insulating layer 235.

According to some embodiments, the spacers may be made from a material which can be removed while minimizing an etching damage with respect to the gate insulating layer 235. For example, if the gate insulating layer 235 contacting the spacers is a silicon oxide layer, the spacers may be silicon nitride. According to some embodiments, the spacers may be formed from the same material as the semiconductor pattern. For example, the spacers may be formed of amorphous silicon or polycrystalline silicon. The spacers may be used as part of the semiconductor pattern 300 without an additional removal process.

The exposed gate insulating layer 235 is etched using the spacers as an etching mask. Accordingly, a top surface of the substrate 100 is exposed at a bottom of the opening 220. After forming the openings 220, the spacers may be removed.

Figure 18:
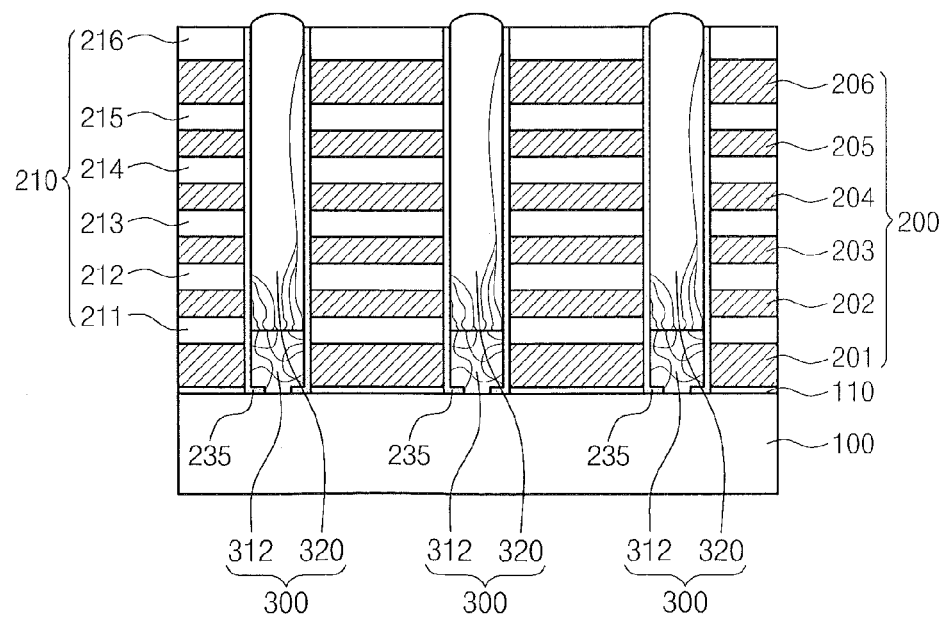

Referring to FIGS. 17 and 18, semiconductor patterns 300 are formed in the openings 220. Forming the semiconductor patterns 300, as for other above-described embodiments, may include forming a precursor semiconductor patterns, phase-changing portions of the precursor semiconductor patterns and recrystallizing the phase-changed portions of the precursor semiconductor patterns.

As described above, the precursor semiconductor patterns contacting the substrate 100 at bottoms of the openings 220 are formed while covering the gate insulating layer 235. The precursor semiconductor patterns may be polycrystalline silicon or amorphous silicon and a crystalline structural discontinuous interface may be formed in the semiconductor patterns 300. The precursor semiconductor patterns may fill the openings 220 in which the gate insulating layer 235 is formed or may be conform to sidewalls of the openings 220. The precursor semiconductor patterns may have a pillar shape or a hollow cylindrical shape. If they have a hollow cylindrical shape, an inner space of the cylinder may be filled with insulating material. A thickness of the semiconductor patterns may be less than a width of a depletion region to be created therein or may be smaller than an average length of silicon grains in the constituent polycrystalline silicon.

After forming the precursor semiconductor patterns, a laser annealing process is performed to phase-change a portion of the precursor semiconductor patterns to a liquid state. When the laser annealing process is performed, a laser beam is irradiated on top surfaces of the precursor semiconductor patterns and thereby a lower portion of the precursor semiconductor pattern adjacent to the substrate 100 may remain without being melted. The amorphous or polycrystalline lower semiconductor region 312 contacting the substrate 100 is formed in the first opening 220 and a liquid state semiconductor region 314 may be formed on the lower semiconductor region 312. When the laser annealing process is performed, a laser energy density may be controlled so that the lower semiconductor region 312 is adjacent to the lowest layer conductive line 201 used as a ground select line.

After laser annealing the precursor semiconductor pattern, the liquid state semiconductor region 314 is recrystallized to form the upper semiconductor region 320. If the semiconductor region 314 is an amorphous semiconductor, the upper semiconductor region 320 may include a polycrystalline semiconductor pattern having grains of relatively large size. If the semiconductor region 314 is polycrstalline, a mean grain size of the upper semiconductor region 320 may be larger than a mean grain size of the lower semiconductor region 312. As described for some embodiments, the semiconductor patterns 300 may have upper and lower semiconductor patterns having different crystalline structures.

Because the upper semiconductor regions 320 include semiconductor material recrystallized by a laser annealing process, a grain size in lower portions of the upper semiconductor regions 320 adjacent to the lower semiconductor regions 312 may be smaller than a grain size in an upper portion of the upper semiconductor regions 320 adjacent to a top surface of the interconnection structure 200. The upper semiconductor regions 320 may include grains vertically and horizontally grown from a top surface of the lower semiconductor regions 312 and a grain size in lower portions of the upper semiconductor regions 320 may be smaller than a grain size in upper portions of the upper semiconductor regions 320. A grain size in the upper semiconductor regions 320 may increase with distance from the substrate 100 and portions of the upper portions of the upper semiconductor regions 320 may include a single crystal. Because a crystalline structure and a grain size in the lower portions and the upper portions of the semiconductor patterns 300 are different, interfaces may be formed between the upper and lower semiconductor patterns 320 and 312. Because it may be advantageous for portions of the semiconductor patterns 300 used as channels of the memory cells to include large grains, the interfaces between the lower semiconductor regions 312 and the upper semiconductor regions 320 may be formed between the ground select line 201 and the word line 202 which is the lowest layer. The interfaces between the lower semiconductor regions 312 and the upper semiconductor regions 320 may be formed below the conductive pattern 201 used as the ground select line GSL.

Referring back to FIGS. 13 and 14, drain regions D used as drain electrodes of cell strings may be formed on the upper portions of the semiconductor patterns 300. Subsequently, the highest upper gate layer 206 is patterned to form string select lines 206'.

According to some embodiments, forming the string select lines 206' may include patterning the highest interlayer insulating layer 216 and the highest upper gate layer 206 after forming a conductive layer 270 on the drain region D. The conductive layer 270 may prevent the semiconductor patterns 300 from being etching-damaged in a subsequent process and can directly contact an upper portion (i.e., the drain region D) of the semiconductor patterns 300. It may be desirable that the conductive layer 270 be formed from one or more materials which can form an ohmic contact with the semiconductor pattern 300. The patterned conductive layer 270 may be used as a bit line (BL of FIG. 13) of the semiconductor memory device.

Figure 19:
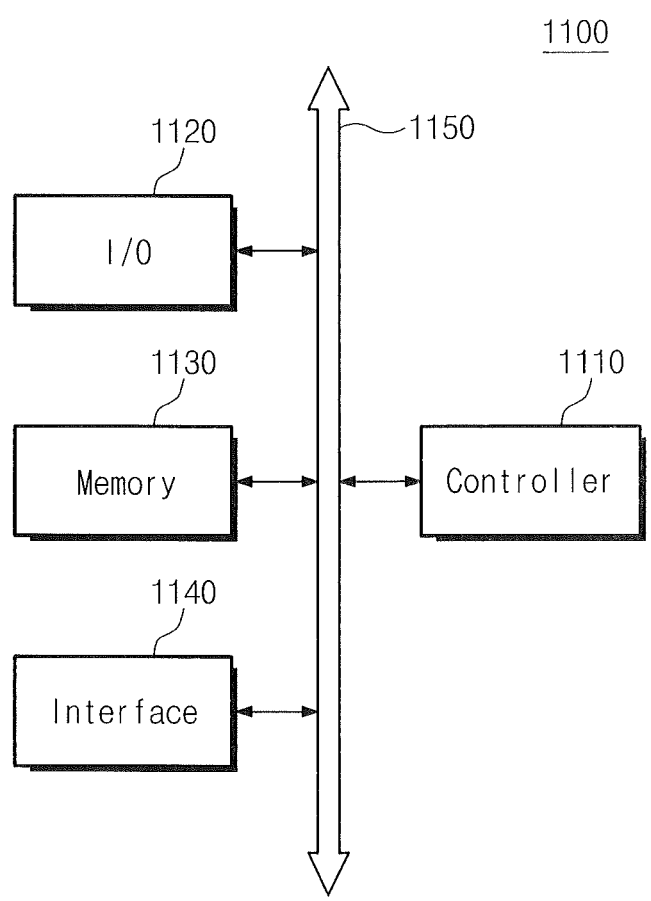
FIG. 19 is a block diagram illustrating an example of a memory system including a semiconductor memory device in accordance with some embodiments of the inventive subject matter.

FIG. 19 is a block diagram illustrating an example of a memory system including a semiconductor memory device in accordance with some embodiments of the inventive subject matter.

Referring to FIG. 19, a memory system 1100 can be applied to a PDA (personal digital assistant), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a keypad and a displayer, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a displayer.

The memory 1130 includes the nonvolatile memory device according to embodiments of the inventive subject matter. The memory 1130 may further include a different kind of memory, a volatile memory device capable of random access and various kinds of memories.

The interface 1140 transmits data to a communication network or receives data from a communication network.

Figure 20:
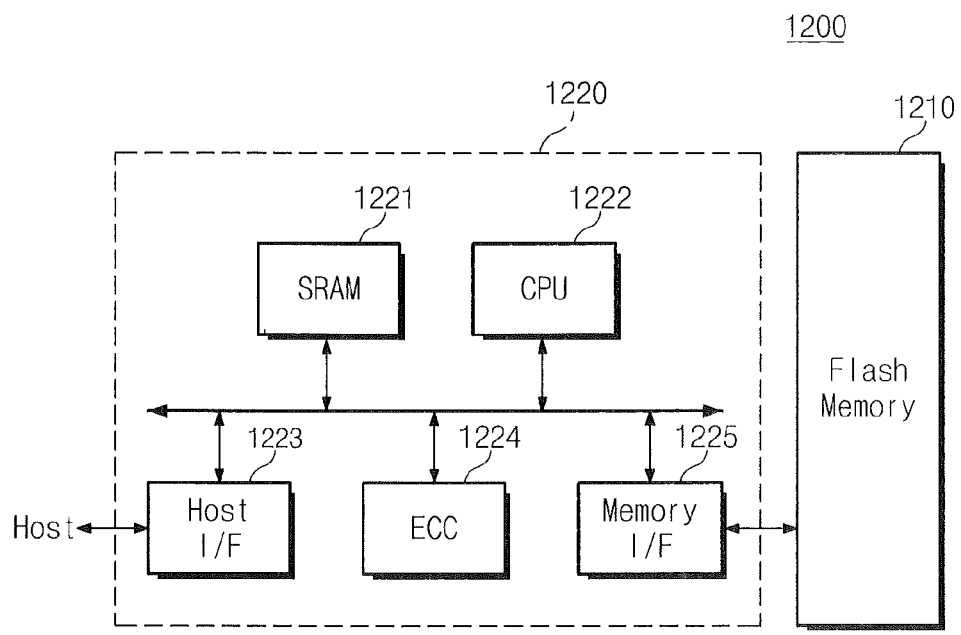
FIG. 20 is a block diagram illustrating an example of a memory card including a semiconductor memory device in accordance with some embodiments of the inventive subject matter.

FIG. 20 is a block diagram illustrating an example of a memory card including a semiconductor memory device in accordance with some embodiments of the inventive subject matter.

Referring to FIG. 20, the memory card 1200 for supporting a storage capability of a large capacity is fitted with a flash memory device 1210 according to some embodiments of the inventive subject matter. The memory card 1200 according to some embodiments of the inventive subject matter includes a memory controller 1220 controlling every data exchange between a host and the flash memory device 1210.

A SRAM 1221 is used as an operation memory of a processing unit 1222. A host interface 1223 includes data exchange protocols of a host to be connected to the memory card 1200. An error correction block 1224 detects and corrects errors included in data readout from a multi bit flash memory device 1210. A memory interface 1225 interfaces with the flash memory device 1210 of some embodiments of the inventive subject matter. The processing unit 1222 performs every control operation for exchanging data of the memory controller 1220. Even though not depicted in drawings, it is apparent to one of ordinary skill in the art that the memory card 1200 according to some embodiments of the inventive subject matter can further include a ROM (not shown) storing code data for interfacing with the host.

Figure 21:
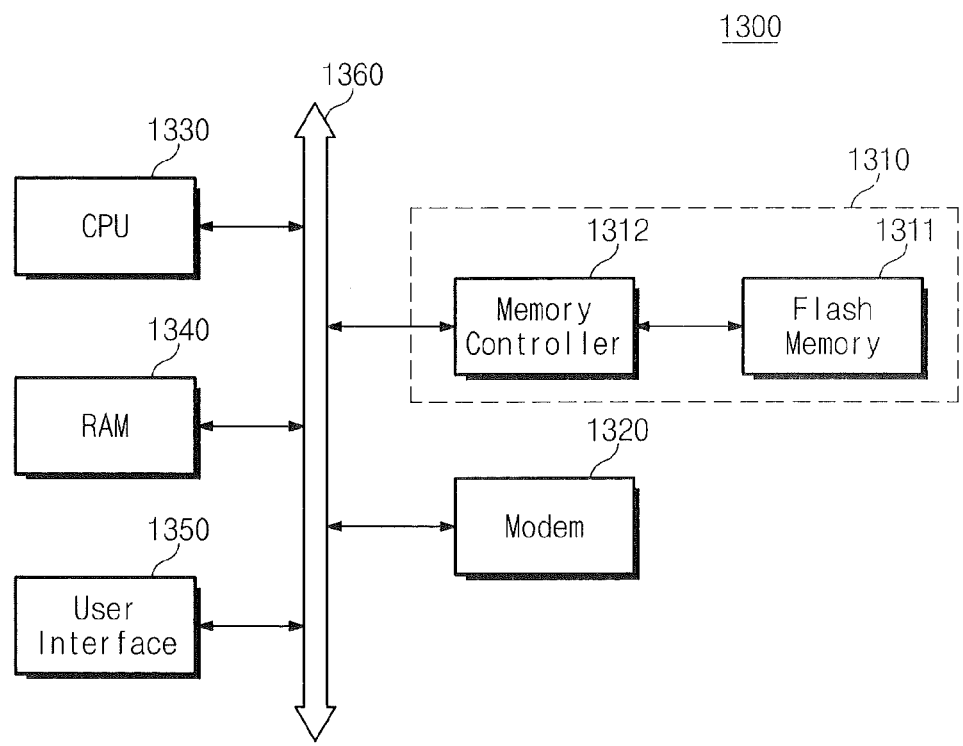
FIG. 21 is a block diagram illustrating an example of an information processing system including a semiconductor memory device in accordance with some embodiments of the inventive subject matter.

FIG. 21 is a block diagram illustrating an example of an information processing system including a semiconductor memory device in accordance with some embodiments of the inventive subject matter.

Referring to FIG. 21, a flash memory system 1310 of the inventive subject matter is built in a data processing system such as a mobile product or a desk top computer. The data processing system 1300 according to the inventive subject matter includes the flash memory system 1310 and a modem 1320, a central processing unit 1330, a RAM (random access memory), a user interface 1350 that are electrically connected to a system bus 1360. The flash memory system 1310 may be constructed so as to be identical to the memory system or the flash memory system described above. The flash memory system 1310 stores data processed by the central processing unit 1330 or data inputted from an external device. The flash memory system 1310 may include a SSD (solid state disk) and in this case, the data processing system 1310 can stably store huge amounts of data in the flash memory system 1310. As reliability is improved, the flash memory system 1310 can reduce resources used to correct errors, thereby providing a high speed data exchange function to the data processing system 1300. Even though not depicted in the drawings, it is apparent to one of ordinary skill in the art that the data processing unit 1300 according to some embodiments of the inventive subject matter can further include an application chipset, a camera image processor (CIS) and/or an input/output device.

Flash memory devices or memory systems according to the inventive subject matter can be mounted with various types of packages. For example, a flash memory device or a memory system according to the inventive subject matter can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

According to some embodiments of the inventive subject matter, since a semiconductor pattern is recrystallized by a laser annealing process to be formed, a grain size of an upper portion of the semiconductor pattern used as a channel of memory cell transistors may increase.

As a grain size in the semiconductor pattern increases, a grain boundary which exists in the semiconductor pattern may be reduced. Since a grain boundary disturbing a movement of charges in the semiconductor pattern may be reduced, a charge moving speed may become fast when a three-dimensional semiconductor memory device operates. Thus, in a three-dimensional semiconductor memory device, an operation speed may be improved when reading data from memory cells or writing data in memory cells.

Although a few embodiments of the present general inventive subject matter have been shown and described, it will be appreciated by those skilled in the art that changes may be made in these embodiments without departing from the principles and spirit of the general inventive subject matter, the scope of which is defined in the appended claims and their equivalents. Therefore, the above-disclosed subject matter is to be considered illustrative, and not restrictive.

What is claimed is:

1. A memory device comprising:
   a stack of interleaved conductive patterns and insulating patterns disposed on a substrate; and
   a semiconductor pattern passing through the stack of conductive patterns and insulating patterns to contact the substrate, the semiconductor pattern having a graded grain size distribution wherein a mean grain size in a first portion of the semiconductor pattern proximate the substrate is less than a mean grain size in a second portion of the semiconductor pattern further removed from the substrate.

2. The memory device of claim 1, wherein the first portion of the semiconductor pattern comprises an amorphous semiconductor material or a polycrystalline semiconductor material and wherein the second portion of the semiconductor pattern comprises a polycrystalline semiconductor.

3. The memory device of claim 1, wherein the second portion of the semiconductor pattern comprises a polycrystalline semiconductor material recrystallized by a laser annealing process.

4. The memory device of claim 1, wherein grain size of the second portion of the pattern increases with distance from the substrate.

5. The memory device of claim 1, wherein the semiconductor pattern has a cylindrical shape or a pillar shape.

6. The memory device of claim 1, further comprising a data storage layer interposed between the semiconductor pattern and the conductive patterns.

7. The memory device of claim 6, wherein the data storage layer is disposed on sidewalls of the insulating patterns and the conductive patterns.

8. The memory device of claim 6, wherein the data storage layer conforms to top and bottom surfaces of the conductive patterns.

9. A memory device comprising:
   a ground select line pattern on a substrate;
   a stack of interleaved word line patterns and insulating patterns disposed on the ground select line pattern; and
   a semiconductor pattern passing through the gate patterns, the insulating patterns and the ground select line pattern to contact the substrate, the semiconductor pattern having a first portion disposed laterally adjacent the ground select line pattern and having a first mean grain size and a second portion laterally adjacent the word line patterns and having a second mean grain size greater than a the first mean grain size.

10. The memory device of claim 9, wherein the first portion of the semiconductor pattern comprises an amorphous semiconductor material or a polycrystalline semiconductor material and wherein the second portion of the semiconductor pattern comprises a polycrystalline semiconductor.

11. The memory device of claim 9, wherein grain size of the second portion of the pattern increases with distance from ground select line pattern.

12. The memory device of claim 9, further comprising a data storage layer interposed between the semiconductor pattern and the word line and ground select line patterns.

* * * * *